United States Patent [19]

Lazarus et al.

[11] Patent Number: 5,130,409

[45] Date of Patent: Jul. 14, 1992

[54] MIXED ALDEHYDE NOVOLAK RESINS USEFUL AS HIGH CONTRAST HIGH THERMAL STABILITY POSITIVE PHOTORESISTS

[75] Inventors: Richard M. Lazarus, Mission Viejo; Randall Kautz, Irvine; Sunit S. Dixit, Mission Viejo, all of Calif.

[73] Assignee: Morton International, Inc., Chicago, Ill.

[21] Appl. No.: 614,636

[22] Filed: Nov. 16, 1990

Related U.S. Application Data

[60] Division of Ser. No. 454,409, Dec. 21, 1989, Pat. No. 4,997,734, which is a division of Ser. No. 227,404, Aug. 2, 1988, Pat. No. 4,920,028, which is a continuation-in-part of Ser. No. 297,828, Apr. 22, 1988, abandoned, which is a continuation-in-part of Ser. No. 175,473, Aug. 31, 1988, abandoned.

[51] Int. Cl.$^5$ .................. C08G 8/04; C08G 14/02; G03C 1/52; G03C 5/00
[52] U.S. Cl. .................................... 528/155; 430/17; 430/18; 430/141; 430/192; 430/311; 430/326; 430/330; 528/129; 528/156
[58] Field of Search ............... 528/129, 155; 430/326, 430/330, 311, 141, 17, 18, 1.92

[56] References Cited

U.S. PATENT DOCUMENTS

| | | | |
|---|---|---|---|
| 4,308,368 | 12/1981 | Kubo et al. | 430/192 |
| 4,477,553 | 10/1984 | Yamamoto et al. | 430/192 |
| 4,529,682 | 7/1985 | Toukhy | 528/155 |
| 4,536,465 | 8/1985 | Uehara et al. | 430/192 |
| 4,642,282 | 2/1987 | Stahlhofen | 430/192 |

FOREIGN PATENT DOCUMENTS

| | | | |
|---|---|---|---|
| 211667 | 2/1987 | European Pat. Off. | 430/192 |
| 0147406 | 9/1983 | Japan | 528/499 |

Primary Examiner—John Kight, III
Assistant Examiner—T. Mosley
Attorney, Agent, or Firm—George W. Rauchfuss, Jr.; Gerald K. White

[57] ABSTRACT

Novolak resins are provided which are the condensation product of (a) a phenol, phenol derivative, or mixtures thereof, and (b) a mixture of formaldehyde or a formaldehyde precursor and an aromatic aldehyde. When the aromatic aldehyde is a monohydroxy aromatic aldehyde, the novolak resin is especially useful in positive photoresist formulations.

1 Claim, No Drawings

MIXED ALDEHYDE NOVOLAK RESINS USEFUL AS HIGH CONTRAST HIGH THERMAL STABILITY POSITIVE PHOTORESISTS

RELATED APPLICATIONS

This Application is a divisional of application Ser. No. 07/454,409, filed Dec. 21, 1989 now U.S. Pat. No. 4,997,734 which is a divisional of application Ser. No. 07/227,404, filed Aug. 2, 1988, now U.S. Pat. No. 4,920,028 which is a C-I-P of abandoned application Ser. No. 07/297,828, filed Apr. 22, 1988, which is a C-I-P of abandoned application Ser. No. 07/175,473, filed Mar. 31, 1988.

BACKGROUND OF THE INVENTION

1. Field of the Invention

The present invention relates generally to novolak resins, and, in particular, to novolak resins which are prepared using a mixture of aldehydes.

The present invention also relates generally to radiation-sensitive positive photoresist compositions and particularly to such compositions containing a novolak resin prepared from a mixture of aldehydes.

2. Description of the Prior Art

Positive photoresist formulations such as are described in, for example, U.S. Pat. Nos. 3,666,473; 4,115,128; 4,173,470; 4,377,631; 4,536,465 and 4,529,682 (each of which is hereby incorporated by reference herein), include alkali-soluble phenol-formaldehyde or cresol-formaldehyde resins together with light-sensitive materials, usually a substituted naphthoquinone diazide compound. The resins and sensitizers are dissolved in an organic solvent or mixture of solvents and are applied in a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation-induced structural transformation which decreases its efficiency as a dissolution rate inhibitor for the novolak and, subsequently, the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern of photoresist on the substrate.

Positive photoresists, especially those used to prepare microelectronic silicon wafers and chips, are often subjected to temperatures during the manufacture of the finished article which are high enough to have a deleterious effect on the photoresist. Thus, positive photoresists having improved thermal stability have long been sought. However, it is also very important that the photoresist be capable of providing high optical resolution so that precise patterns can be applied to the substrate. While positive photoresists having high resolution and contrast characteristics, such as DYNALITH® EPR-5000 resist sold by the Dynachem Division of Morton Thiokol, Inc., are known, and positive photoresists having good thermal stability, such as DYNALITH® OFPR-800 resist also sold by the Dynachem Division of Morton Thiokol, Inc., are also known, the art has yet to develop a positive photoresist which combines these thermal stability and high resolution and high contrast characteristics. In fact, formulation of a positive photoresist to enhance one of these characteristics normally adversely affects the other characteristic, i.e. photoresists with good thermal stability do not provide high resolution and high contrast and vice versa.

It has now been quite surprisingly found that positive photoresists having both a high degree of thermal stability and high resolution can be made when the novolak resin employed is prepared from a mixture of aldehydes comprising formaldehyde (or a formaldehyde precursor) and a monohydroxy aromatic aldehyde.

SUMMARY OF THE INVENTION

In accordance with the present invention, there is provided a new, improved class of novolak resins which are the condensation product of (a) a phenol, phenol derivative or mixture thereof, and (b) an aldehyde, wherein the improvement comprises using as the aldehyde a mixture of formaldehyde (or formaldehyde precursor) and an aromatic aldehyde.

There is also provided in accordance with the present invention an improved positive photoresist comprising a novolak resin and photosensitizer wherein the improvement comprises employing as the novolak resin the condensation product of (a) a phenol, phenol derivative or mixture thereof, and (b) a mixture of aldehydes comprising formaldehyde (or a formaldehyde precursor) and a monohydroxy aromatic aldehyde.

Further provided in accordance with the present invention is a positive photoresist composition comprising:

A. a novolak resin comprising the condensation product of (a) a phenol, phenol derivative or mixture thereof, and (b) a mixture of aldehydes comprising formaldehyde (or a formaldehyde precursor) and a monohydroxy aromatic aldehyde; and B. a photosensitizer.

The present invention also provides a method of forming a resist pattern on a substrate comprising:

I. coating said substrate with a layer of a positive photoresist composition;

II. exposing said layer patternwise to actinic radiation; and

III. removing the exposed portion of said layer with an aqueous alkaline developer for the exposed resist composition to uncover the areas of the substrate beneath the exposed portions; said positive photoresist comprising, prior to exposure:

A. a novolak resin comprising the condensation product of (a) a phenol, phenol derivative or mixture thereof, and (b) a mixture of aldehydes comprising formaldehyde (or a formaldehyde precursor) and a monohydroxy aromatic aldehyde; and B. a photosensitizer.

In accordance with the present invention, there is also provided a substrate coated with a thermally stable and highly resolved, exposed resist pattern, said resist pattern being formed from a positive photoresist composition which, prior to exposure to actinic radiation, comprises:

A. a novolak resin comprising the condensation product of (a) a phenol, phenol derivative or mixture thereof, and (b) a mixture of aldehyde comprising formaldehyde (or a formaldehyde precursor) and a monohydroxy aromatic aldehyde; and B. a photosensitizer.

DETAILED DESCRIPTION OF PREFERRED EMBODIMENTS

The novolak resins of the present invention are prepared from (1) phenol or a phenol derivative, and (2) a mixture of aldehydes which contains formaldehyde (or a formaldehyde precursor) and an aromatic aldehyde. The phenol and phenol derivatives useful in preparing these novolak resins include, but are not limited to, phenol, m-cresol, p-cresol, o-cresol, and mixtures thereof. Other examples of phenol derivatives may be found in H. Hiraoka, "Functionally Substituted Novolak Resins: Lithographic Applications, Radiation Chemistry, and Photooxidation", *Materials For Microlithography*, ACS Symposium Series No. 266 (1984) which is hereby incorporated by reference herein. They may also contain other substituents on the aromatic ring including, for example, alkyl or halogen moieties.

The mixed aldehydes useful in preparing the novolak resins of the present invention contain formaldehyde or a formaldehyde precursor. As used herein, "formaldehyde precursor" refers to compounds, such as 1,3,5-S-trioxane and paraformaldehyde which, under the reaction conditions employed to prepare the novolak resin will produce formaldehyde. As used herein, the term "formaldehyde" is understood to include both formaldehyde per se and formaldehyde precursors. The second component of the aldehyde mixture is any aromatic aldehyde which will form a novolak resin with phenol or a phenol derivative. In general, however, these aromatic aldehydes include, but are not limited to, compounds having the general formula:

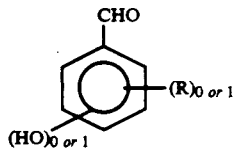

where R is halogen (e.g. chlorine), alkyl (e.g. $C_1$–$C_4$ alkyl). Examples of preferred aromatic aldehydes include benzaldehyde, 2-chlorobenzaldehyde, and monohydroxy aromatic aldehydes such as 2-hydroxybenzaldehyde, 3-hydroxybenzaldehyde, and 4-hydroxybenzaldehyde. Mixtures of aromatic aldehydes may also be used. The monohydroxybenzaldehydes are particularly preferred since they produce novolak resin which may be used to make high resolution, high thermal stability positive photoresists.

The relative amounts of the phenol or phenol derivative and mixed aldehydes used to prepare to novolak resins of the present invention may vary considerably. In general, these relative amounts are chosen to produce novolak resins having high melting points (Tg), high degree of substitution at the bridging carbons and relatively low molecular weights (compared to novolak resins prepared from formaldehyde only). Typically, the following amounts of reactants are employed to produce the novolak resins of this invention.

$$\frac{\text{Moles total aldehyde}}{\text{Moles total phenol or phenol derivative}} \times 100 = \text{about 60\% to about 95\%}$$

$$\frac{\text{Moles aromatic aldehyde}}{\text{Moles total aldehyde}} \times 100 = \text{about 15\% to about 95\%}$$

In a preferred embodiment, the phenol component is a mixture of phenol derivatives; namely, a mixture of m-cresol and p-cresol. When such a mixture is employed, it typically contains the following relative amounts of m- and p-cresol;

$$\frac{\text{Moles m-cresol}}{\text{Moles total cresol*}} \times 100 = \text{about 30\% to about 75\%}$$

*It is not uncommon for commercially available cresols to contain minor amounts of o-cresol. Therefore, "Moles total cresol" refers to moles of m-, p-, and o-cresol (if any) and not just m- and p-cresol. It is preferred, however, that the o-cresol content be less than about 1% of the total cresol.

Given the above reactants and their relative amounts, one of ordinary skill in the art would be capable of preparing the novolak resins of the present invention without undue experimentation. Basically, all of the ingredients are placed in a suitable reaction vessel and a nonreactive solvent added. An acid catalyst, such as p-toluenesulfonic acid, is added in a mole ratio of moles catalyst/moles total cresol of about 0.01 to about 0.04. The reaction mixture is then raised to reflux temperature and reflux maintained until no more by-product water is produced, indicating that the reaction is complete.

The novolak resins of the present invention are especially useful in positive photoresist formulations. These formulations typically contain a novolak resin, a sensitizer (or "photoactive component"), solvent and various additives such as colorants, striation aids, and the like. In commercial positive photoresists, the novolak resin is most commonly a cresol-formaldehyde novolak and the photoactive component is a diazo quinone compound. Examples of diazo quinone compounds include 2,3,4-trihydroxybenzophenone-1, 2-napthoquinonediazide-5-sulfonic acid mono-, di-, and triesters and 2,3,4-trihydroxybenzophenone-1,2-naphthoquinone -2-diazo-4-sulfonic acid mono-, di-, and triesters. Examples of these and other diazo sensitizers may be found in U.S. Pat. No. 4,499,171 issued Feb. 12, 1985 to Hosaka et al., which is hereby incorporated by reference herein. Examples of solvents include, but are not limited to, propylene glycol monomethyl ether acetate (PMA), ethyl cellosolve acetate, ethyl 3-ethoxy propionate, diglyme, butyrolactone, xylene, and butyl acetate.

The critical components of the positive resist formulation, namely, the novolak resin of the present invention and the photoactive component, can be employed over a wide range of relative amounts. In general, it is necessary only that sufficient photoactive component be employed to produce a resist which is photoimagable and that the amount of novolak resin be bindingly effective. In terms of relative amounts, the positive photoresists of this invention may contain from about 2 parts by weight (pbw) novolak resin per pbw photoactive component to about 6 pbw novolak resin per pbw photoactive component. Preferably, a ratio of about 4 pbw novolak resin per pbw photoactive component is employed.

The amount of solvent in the resist may likewise vary considerably. Generally, all that is required is that sufficient solvent be employed to produce a desired coating thickness under the given coating conditions, e.g. spin speed and pre-bake temperature. Typically, however, enough solvent is added to the positive photoresist formulation to produce a photoresist having about 25-30% solids.

The positive resists of this invention may also contain various additives such as colorants, striation aids, and the like. Also, the novolak resin component of the resist may be comprised entirely of the novolak resins of the present invention, or may contain up to about 35 weight percent (based on the total weight of the resin component of the resist) of a conventional novolak resin, such as a cresol/formaldehyde novolak resin prepared using a mixture of 65-70% m-cresol and 30-35% p-cresol.

Positive resists formulated with the novolak resins of the present invention which are prepared from the preferred monohydroxybenzaldehydes have relatively high thermal stability. For example, resists which employ the formaldehyde/monohydroxybenzaldehyde mixture are stable for at least about 30 minutes in a conventional oven at temperatures of about 200°-220° C. whereas the aforementioned DYNALITH® EPR-5000 resist is stable only to about 140° C. and DYNALITH® OFPR-800 resist is stable only to about 180° C. when baked for about 30 minutes in a conventional oven.

The following examples illustrate the present invention:

EXAMPLE 1

This example illustrates a typical procedure for making the novolak resins of the present invention.

The following reagents were used in the amounts indicated:

| REAGENT | AMOUNT |
| --- | --- |
| m-cresol | 125.9 g |
| p-cresol | 103.0 g |
| o-hydroxybenzaldehyde (98%) | 123.6 g |
| trioxane | 30.1 g |
| Isopropyl acetate | 313.5 g |
| p-toluenesulfonic acid $H_2O$ catalyst | 4.0 g |

All of the ingredients, except the catalyst, were combined in a suitable reaction vessel. The catalyst was then added and the resulting reaction mixture was heated at reflux temperature. Reflux was continued until no more by-product water was produced, which indicated completion of the reaction. The resulting novolak resin was then recovered.

EXAMPLES 2-30

Novolak resins in accordance with this invention were prepared in a manner similar to that of Example 1 using the reagents indicated in Table I below.

TABLE I

| Ex. No. | Cresol A | Cresol B | Ald. 1 | Ald. 2 | Cat. | $^1$Rc | $^2$Rf | $^3$Ra | $^4$Rh | $^5$Rw | °C. | Hr. |
| --- | --- | --- | --- | --- | --- | --- | --- | --- | --- | --- | --- | --- |
| 2 | m-cresol | p-cresol | Formald | 4HB$^6$ | pTSA$^7$ | 0.349 | 0.645 | 0.188 | 0.025 | 1.55 | 95-120 | 27 |
| 3 | m-cresol | p-cresol | Formald | 4HB | pTSA | 0.350 | 0.640 | 0.500 | 0.025 | 0.95 | 95-120 | 24 |
| 4 | m-cresol | p-cresol | Formald | 4HB | pTSA | 0.350 | 0.700 | 0.500 | 0.040 | 1.04 | 95-120 | 15 |
| 5 | m-cresol | p-cresol | Formald | 4HB | pTSA | 0.450 | 0.700 | 0.500 | 0.040 | 1.04 | 95-120 | 16 |
| 6 | m-cresol | p-cresol | Formald | 4HB | pTSA | 0.450 | 0.760 | 0.500 | 0.040 | 1.04 | 95-120 | 16 |
| 7 | m-cresol | p-cresol | Formald | 4HB | pTSA | 0.550 | 0.700 | 0.490 | 0.040 | 1.04 | 95-120 | 16 |
| 8 | m-cresol | p-cresol | Formald | 4HB | pTSA | 0.550 | 0.760 | 0.486 | 0.040 | 1.13 | 95-120 | 15 |
| 9 | m-cresol | p-cresol | Formald | 4HB | pTSA | 0.550 | 0.810 | 0.500 | 0.040 | 1.20 | 95-120 | 15 |
| 10 | m-cresol | p-cresol | Formald | 4HB | pTSA | 0.647 | 0.705 | 0.497 | 0.032 | 1.04 | 95-120 | 16 |
| 11 | m-cresol | p-cresol | Formald | 4HB | pTSA | 0.650 | 0.760 | 0.500 | 0.040 | 1.13 | 95-120 | 15 |
| 12 | m-cresol | p-cresol | Formald | 2HB$^8$ | pTSA | 0.350 | 0.666 | 0.508 | 0.025 | 0.960 | 95-120 | 17 |
| 13 | m-cresol | p-cresol | Formald | 2HB | pTSA | 0.350 | 0.747 | 0.500 | 0.040 | 1.180 | 95-120 | 15 |
| 14 | m-cresol | p-cresol | Formald | 2HB | pTSA | 0.449 | 0.698 | 0.500 | 0.040 | 1.040 | 95-120 | 16 |
| 15 | m-cresol | p-cresol | Formald | 2HB | pTSA | 0.450 | 0.764 | 0.500 | 0.040 | 1.130 | 95-120 | 14 |
| 16 | m-cresol | p-cresol | Formald | 2HB | pTSA | 0.550 | 0.708 | 0.549 | 0.040 | 1.040 | 95-120 | 15 |
| 17 | m-cresol | p-cresol | Formald | 2HB | pTSA | 0.550 | 0.767 | 0.491 | 0.040 | 1.130 | 95-120 | 15 |
| 18 | m-cresol | p-cresol | Triox$^9$ | 2HB | pTSA | 0.550 | 0.756 | 0.503 | 0.020 | 0.248 | 85-95 | 15 |
| 19 | m-cresol | p-cresol | Triox | 2HB | pTSA | 0.550 | 0.784 | 0.498 | 0.015 | 0.020 | 110-115 | 11 |
| 20 | m-cresol | p-cresol | Triox | 2HB | pTSA | 0.550 | 0.788 | 0.502 | 0.020 | 0.264 | 100-105 | 10 |
|  |  |  |  |  |  |  | 0.812 | 0.502 |  |  |  | 20 |
|  |  |  |  |  |  |  |  |  |  |  |  | 28 |
| 21 | m-cresol | p-cresol | Triox | 2HB | pTSA | 0.550 | 0.856 | 0.502 | 0.010 | 0.533 | 100-105 | 28 |
| 22 | m-cresol | p-cresol | Triox | 2HB | pTSA | 0.550 | 0.950 | 0.500 | 0.010 | 0.535 | 100-105 | 24 |
| 23 | m-cresol | p-cresol | Triox | 2HB | pTSA | 0.551 | 0.379 | 1.000 | 0.010 | 0.010 | 110-135 | 10 |
|  |  |  |  |  |  |  | 0.766 | 0.506 |  |  |  | 20 |
| 24 | m-cresol | p-cresol | Triox | 2HB | pTSA | 0.550 | 0.427 | 1.000 | 0.010 | 0.535 | 100-105 | 14 |
|  |  |  |  |  |  |  | 0.854 | 0.502 |  |  |  | 28 |
| 25 | m-cresol | p-cresol | Triox | 2HB | pTSA | 0.547 | 0.423 | 1.000 | 0.010 | 0.010 | 100-135 | 11 |
|  |  |  |  |  |  |  | 0.846 | 0.499 |  |  |  | 22 |
| 26 | m-cresol | p-cresol | Triox | 2HB | pTSA | 0.548 | 0.944 | 0.495 | 0.010 | 0.010 | 115-120 | 18 |
| 27 | m-cresol | p-cresol | Triox | 2HB | pTSA | 0.550 | 0.900 | 0.250 | 0.010 | 0.010 | 115-120 | 19 |
| 28 | m-cresol | p-cresol | Triox | 2HB | pTSA | 0.550 | 0.900 | 0.500 | 0.010 | 0.010 | 115-120 | 19 |
| 29 | m-cresol | p-cresol | Triox | 2HB | pTSA | 0.550 | 0.900 | 0.750 | 0.010 | 0.010 | — | 19 |
| 30 | m-cresol | p-cresol | Formald | Benz$^9$ | pTSA | 0.55 | 0.9 | 0.75 | 0.01 | 0.01 | — | — |

$^1$Rc = moles m-cresol/total moles cresol
$^2$Rf = total moles aldehyde/total moles cresol
$^3$Ra = moles aldehyde 2/total moles aldehyde
$^4$Rh = moles catalyst/total moles cresol
$^5$Rw = moles water/total moles cresol
$^6$4HB = 4-hydroxybenzaldehyde
$^7$pTSA = p-toluenesulfonic acid
$^8$2HB = 2-hydroxybenzaldehyde
$^9$Benz = benzaldehyde

COMPARATIVE EXAMPLES A-J

For comparative purposes, novolak resins prepared from a single aldehyde were made using a procedure similar to that of Example 1 and the reagents shown in Table A.

TABLE A

| Ex. No. | Cresol A | Cresol B | Ald. 1 | Ald. 2 | Cat. | Rc | Rf | Ra | Rh | Rw | °C. | Hr. |
|---|---|---|---|---|---|---|---|---|---|---|---|---|
| A | m-cresol | p-cresol | — | Benzald | pTSA | 0.354 | 0.631 | 1.000 | 0.036 | 0.04 | 100–120 | 4 |
| B | m-cresol | p-cresol | — | 2ClBenzald[a] | pTSA | 0.354 | 0.640 | 1.000 | 0.039 | 0.04 | 95–110 | 4 |
| C | m-cresol | p-cresol | — | 4HB | pTSA | 0.354 | 0.640 | 1.000 | 0.040 | 0.04 | 100–130 | 4 |
| D | m-cresol | p-cresol | — | 4HB | pTSA | 0.354 | 0.640 | 1.000 | 0.040 | 0.04 | 100–130 | 4 |
| E | m-cresol | p-cresol | — | 4HB | pTSA | 0.350 | 0.810 | 1.000 | 0.039 | 0.04 | 100–105 | 2 |
| F | m-cresol | p-cresol | — | 4HB | pTSA | 0.749 | 0.637 | 1.000 | 0.039 | 0.04 | 95–105 | 13 |
| G | m-cresol | p-cresol | — | 4HB | pTSA | 0.750 | 0.805 | 1.000 | 0.039 | 0.04 | 100–105 | 2 |
| H | m-cresol | p-cresol | — | 2HB | pTSA | 0.354 | 0.639 | 1.000 | 0.040 | 0.04 | 100–120 | 7 |
| I | m-cresol | p-cresol | — | 2HB | pTSA | 0.350 | 0.750 | 1.000 | 0.040 | 0.04 | 100–105 | 8 |
| J | m-cresol | p-cresol | — | Piperonal | pTSA | 0.350 | 0.375 | 1.000 | 0.040 | 0.04 | 100–120 | 16 |

[a]2ClBenzald = 2-chlorobenzaldehyde

EXAMPLES 31–54 AND COMPARATIVE EXAMPLES K–T

The novolak resins prepared in the foregoing examples were used to formulate positive photoresists. The photoresist was prepared by simply blending the ingredients shown in Table II below in the amounts indicated.

TABLE II

| Ex. No. | Novolak 1 from Ex. No./Amnt.[a] | Novolak 2[b]/Amnt. | Amnt. PAC[c] | Amnt. PMA | Other |
|---|---|---|---|---|---|
| 31 | 2/13.89 | 7.48 | 5.33 | 73.00 | 0.28 |
| 32 | 3/13.89 | 7.48 | 5.33 | 73.00 | 0.28 |
| 33 | 4/14.05 | 7.55 | 5.39 | 72.72 | 0.28 |
| 34 | 5/14.05 | 7.57 | 5.40 | 72.69 | 0.28 |
| 35 | 7/14.09 | 7.58 | 5.41 | 72.62 | 0.28 |
| 36 | 8/13.89 | 7.48 | 5.33 | 73.00 | 0.28 |
| 37 | 9/14.02 | 7.55 | 5.39 | 72.72 | 0.28 |
| 38 | 10/14.05 | 7.55 | 5.39 | 72.72 | 0.28 |
| 39 | 11/14.05 | 7.55 | 5.39 | 72.72 | 0.28 |
| 40 | 12/14.04 | 7.55 | 5.39 | 72.72 | 0.28 |
| 41 | 13/14.04 | 7.55 | 5.39 | 72.72 | 0.28 |
| 42 | 14/13.89 | 7.48 | 5.34 | 72.99 | 0.28 |
| 43 | 15/13.89 | 7.48 | 5.34 | 73.00 | 0.27 |
| 44 | 16/13.48 | 7.19 | 6.17 | 72.87 | 0.27 |
| 45 | 17/16.80 | 8.96 | 7.69 | 66.26 | 0.29 |
| 46 | 22/11.92 | 6.35 | 5.45 | 76.65 | 0.26 |
| 47 | 23/14.04 | 7.54 | 5.39 | 72.74 | 0.28 |
| 48 | 24/12.48 | 6.66 | 5.71 | 74.88 | 0.26 |
| 49 | 25/14.04 | 7.54 | 5.39 | 72.73 | 0.28 |
| 50 | 26/14.04 | 7.54 | 5.39 | 72.73 | 0.28 |
| 51 | 27/14.04 | 7.55 | 5.39 | 72.75 | 0.28 |
| 52 | 28/14.04 | 7.55 | 5.39 | 72.74 | 0.28 |
| 53 | 29/14.04 | 7.55 | 5.39 | 72.75 | 0.28 |
| 54 | 30/21.69 | 11.67 | 8.33 | 57.6 | 0.74 |
| K | A/14.00 | 7.53 | 5.38 | 72.83 | 0.28 |
| L | B/13.87 | 7.47 | 5.34 | 73.04 | 0.28 |
| M | C/13.87 | 7.47 | 5.33 | 73.05 | 0.28 |
| N | D/13.87 | 7.47 | 5.33 | 73.03 | 0.28 |
| O | E/14.01 | 7.54 | 5.39 | 72.78 | 0.28 |
| P | F/13.87 | 7.47 | 5.34 | 73.04 | 0.28 |
| Q | G/14.01 | 7.54 | 5.39 | 72.77 | 0.28 |
| R | H/13.99 | 7.54 | 5.39 | 72.80 | 0.28 |
| S | I/14.03 | 7.56 | 5.39 | 72.73 | 0.28 |
| T | J/14.03 | 7.56 | 5.39 | 72.73 | 0.28 |

[a]All amounts are weight percent based on total weight.
[b]Novolak 2 is a low molecular weight cresol/formaldehyde novolak.
[c]PAC = photoactive component.

The following examples illustrate the performance of the positive photoresist formulations of Examples 31–54 and Comparative Examples K–T.

EXAMPLES 55–78 AND COMPARATIVE EXAMPLES U–DD

Each, in turn, of the resist compositions of Examples 31–54 and Comparative Examples K–T was spin coated on a track coater manufactured by Silicon Valley Group, California, onto thermally-grown silicon/silicon dioxide coated wafers of 4 inch diameter and 5000 Angstrom oxide thickness. A uniform coating of 1.0 μm of resist film was obtained at a spinning velocity of 3,500 revolutions per minute. The coated wafers were then soft baked either in an air circulating oven at 120° C. for 30 minutes or on a track with hot plate at 120° C. for 60 seconds. The resist film thickness was then measured with a Nanospec AFT thickness measuring tool.

The coated wafers were exposed with an Ultratech ® ultrastep 1000 (1:1) projection stepper fitted with a lens of N.A. 0.325 to provide ultraviolet exposure radiation in the range of 390 nm–450 nm. A Micromask ® mask with line and space widths of varying sizes, including some as small as 0.75 μm; was used to provide a selective exposure pattern. Exposure times were varied in order to determine the photospeed of the resist, i.e., the minimum amount of exposure energy (intensity × time) in millijoules/cm$^2$ which will solubilize the exposed areas of the resist so that the resist in the exposed areas will be completely removed/cleared during development.

The exposed resist coated wafers produced as described above were placed in Teflon wafer boats and either immersed in a one-gallon Teflon container containing DYNALITH® NMD-3 developer, which is an aqueous alkaline solution stabilized at about 19° C.±1° C., or processed on track developing equipment manufactured by Silicon Valley Group, California. The wafers were allowed to remain immersed in the developer solution for 60 seconds. Upon removal from the developer, the wafers were rinsed in deionized water and dried by a burst of nitrogen gas or by placing them in a spin dryer. Following development, the wafers were examined with an optical microscope at a "1000×" magnification.

Post-baking of the developed wafers was done in an air circulating oven at about 150° C., 180° C., or 200° C. for 30 minutes to increase the adhesion and chemical resistance of the undissolved portions of the coatings. Post-bake flow of the images were examined by an optical microscope at "1000×" magnification.

The results of these performance tests are shown in Table III below:

TABLE III

| Ex. No. | Resist from Ex. No. | Photospeed mj/cm$^2$ | Developer | Dev. Time (Seconds) | % FL$^d$ | Residue$^e$ | Bridges$^f$ | Side Wall$^g$ |
|---|---|---|---|---|---|---|---|---|
| 55 | 31 | >100 | 0.1N DE-3$^h$ | 60 | 0.47 | 0 | 2.00 | +1 |
| (Control$^i$) | | (85) | (0.2N DE-3) | (240) | (0.34) | (0) | (1.50) | — |
| 56 | 32 | 75 | 0.1N DE-3 | 60 | 1.28 | 0 | 0.75 | 0 |
| (Control) | | (85) | (0.2N DE-3) | (240) | (0.34) | (0) | (1.50) | — |
| 57 | 33 | 56 | 9.2N DE-3 | 60 | 0.00 | 0 | 0.75 | — |
| (Control) | | (68) | (0.2N DE-3) | (240) | (0) | (0) | (1.25) | — |
| 58 | 34 | 80 | 0.1N DE-3 | 60 | — | 0 | 1.00 | 0 |
| | | 30 | 0.2N DE-3 | 30 | 18.04 | 0 | 1.00 | — |
| (Control) | | (65) | (0.3N DE-3) | (60) | (0.48) | (0) | (1.50) | — |
| 59 | 35 | 105 | 0.2N DE-3 | 30 | 1.07 | 0 | 0.75 | −1 |
| (Control) | | (65) | (0.3N DE-3) | (60) | (0.48) | (0) | (1.50) | — |
| 60 | 36 | 95 | 0.1N DE-3 | 60 | 1.67 | 0 | 0.75 | +1 |
| (Control) | | (85) | (0.2N DE-3) | (240) | (0.34) | (0) | (1.50) | — |
| 61 | 37 | 70 | 0.1N DE-3 | 60 | 3.34 | 0 | 0.75 | — |
| (Control) | | (80) | (0.2N DE-3) | (240) | (0) | (0) | (1.50) | — |
| 62 | 38 | 45 | 0.2N DE-3 | 60 | 4.33 | 0 | 0.75 | — |
| (Control) | | (68) | (0.2N DE-3) | (240) | (0) | (0) | (1.25) | — |
| 63 | 39 | 30 | 0.1N DE-3 | 60 | 18.01 | 0 | 0.75 | — |
| (Control) | | (80) | (0.2N DE-3) | (240) | (0) | (0) | (1.50) | — |
| 64 | 40 | 40 | 0.2N DE-3 | 30 | 3.81 | 0 | 1.00 | — |
| (Control) | | (155) | (0.2N DE-3) | (60) | (0) | (0) | (1.5) | — |
| 65 | 41 | 70 | 0.2N DE-3 | 30 | 2.6 | 0 | 0.80 | — |
| (Control) | | (65) | (0.3N DE-3) | (60) | (0.48) | (0) | (1.5) | — |
| 66 | 42 | 38 | 0.2N DE-3 | 30 | 9.72 | 0 | 1.00 | — |
| (Control) | | (139) | (0.2N DE-3) | (30) | (0) | (0) | (1.5) | — |
| 67 | 43 | 38 | 0.2N DE-3 | 30 | 5.81 | 0 | 1.00 | — |
| (Control) | | (139) | (0.2N DE-3) | (30) | (0) | (0) | (1.5) | — |
| 68 | 44 | 55 | 0.2N DE-3 | 30 | 4.65 | 0 | 0.80 | — |
| (Control) | | (155) | (0.2N DE-3) | (60) | (0) | (0) | (1.5) | — |
| 69 | 45 | 60 | 0.2N DE-3 | 30 | 3.84 | 0 | 0.80 | — |
| (Control) | | (155) | (0.2N DE-3) | (60) | (0) | (0) | (1.5) | — |
| 70 | 46 | 35 | 0.2N DE-3 | 30 | 5.80 | 0 | 1.00 | −1 |
| (Control) | | (145) | (0.2N DE-3) | (60) | (0.21) | (0) | (1.5) | (0) |
| 71 | 47 | >300 | 0.2N DE-3 | 60 | 1.00 | 10 | unmeas. | — |
| (Control) | | (155) | (0.2N DE-3) | (60) | (0) | (0) | (1.5) | — |
| 72 | 48 | 45 | 0.2N DE-3 | 30 | 0 | 0 | 1.00 | −1 |
| (Control) | | (145) | (0.2N DE-3) | (60) | (0.21) | (0) | (1.5) | (0) |
| 73 | 49 | >270 | 0.2N DE-3 | 60 | 1.50 | 10 | unmeas. | — |
| (Control) | | (155) | (0.2N DE-3) | (60) | (0) | (0) | (1.5) | — |
| 74 | 50 | 185 | 0.2N DE-3 | 60 | 0 | 0 | >0.8 | 0 |
| (Control) | | (155) | (0.2N DE-3) | (60) | (0) | (0) | (1.5) | (0) |
| 75 | 51 | 245 | 0.2N DE-3 | 60 | 0.35 | 0 | 1.00 | — |
| 76 | 52 | 165 | 0.2N DE-3 | 60 | 0.52 | 0 | 0.80 | — |
| 77 | 53 | 70 | 0.2N DE-3 | 60 | 0.23 | 0 | <0.80 | — |
| (Control) | | (155) | (0.2N DE-3) | (60) | (0.07) | (0) | (1.50) | — |
| 78 | 54 | 300 | 1.0N DE-3 | 60 | 2.13 | 1.0 | 2.0 | — |
| (Control) | | (125) | (0.2N DE-3) | (60) | (0) | (0) | (1.5) | — |
| U | K | >600 | 2.70 NMD3$^j$ | 480 | 0.00 | — | — | — |
| V | L | >600 | 2.70 NMD3$^k$ | 480 | 0.00 | — | — | — |
| W | M | 100 | 0.62 TMAH$^k$ | 180 | 4.78 | — | | +1 |
| | | 110 | Dev. A$^l$ | 30 | 2.01 | 9 | 0.75 | +1 |
| | | 40 | 0.2N DE-3 | 60 | 11.12 | 8 | 0.75 | — |
| X | N | 100 | 0.62 TMAH | 180 | 6.66 | 10 | 0.75 | +1 |
| | | 110 | Dev. A | 30 | 4.01 | 9 | 0.75 | +1 |
| | | 40 | 0.2N DE-3 | 60 | 10.68 | 8 | 0.75 | 0 |
| (Control) | | (55) | (2.40 TMAH) | (180) | (1.00) | (0) | (1.50) | — |
| (Control) | | (85) | (0.2N DE-3) | (240) | (0.60) | (0) | (1.50) | — |
| Y | O | 40 | 0.1N DE-3 | 60 | 14.54 | 5 | 1.75 | — |
| (Control) | | (107) | (0.2N DE-3) | (120) | (0) | (0) | (1.50) | — |
| Z | P | 75 | 0.6N DE-3 | 60 | 3.54 | 0 | 0.75 | −1 |
| (Control) | | (>110) | (0.6N DE-3) | (60) | (0) | (0) | (1.25) | — |
| AA | Q | 73 | 0.1N DE-3 | 60 | 10.29 | 3 | 0.75 | — |
| (Control) | | (107) | (0.2N DE-3) | (120) | (0) | (0) | (1.50) | — |
| BB | R | 50 | 0.2N DE-3 | 60 | 10.49 | 0 | 0.75 | — |
| (Control) | | (107) | (0.2N DE-3) | (120) | (0) | (0) | (1.25) | — |
| CC | S | 78 | 0.2N DE-3 | 60 | 1.17 | 0 | 0.75 | — |

TABLE III-continued

| Ex. No. | Resist from Ex. No. | Photospeed mj/cm$^2$ | Developer | Dev. Time (Seconds) | % FL$^d$ | Residue$^e$ | Bridges$^f$ | Side Wall$^g$ |
|---|---|---|---|---|---|---|---|---|
| (Control) | | (68) | (0.2N DE-3) | (240) | (0) | (0) | (1.25) | — |
| DD | T | 50 | 0.2N DE-3 | 60 | 6.35 | 0 | 1.00 | — |
| (Control) | | (69) | (0.2N DE-3) | (240) | — | (0) | (1.50) | — |

$^d$% FL = percent film loss in unexposed areas
$^e$Residue is measured on a 0-10 scale, 0 being no residue; 10 being full coverage of 1 micron lines and spaces
$^f$Bridges = largest geometry bridged (microns)
$^g$Side wall parameter qualifies as more (+1), same as (0), or less (-1) vertical compared to the control
$^h$DE-3 = DYNALITH ® developer sold by the Dynachem Division of Morton Thiokol, Inc.
$^i$All control tests were performed with DYNALITH ® EPR-5000 positive photoresist sold by the Dynachem Division of Morton Thiokol, Inc.
$^j$2.70 NMD3 = 2.70% tetramethylammonium hydroxide in water
$^k$0.62 TMAH = 0.62% tetramethylammonium hydroxide in water
$^l$Dev. A = High contrast developer

We claim:

1. A novolak resin comprising the condensation product of (a) a mixture of m- and p-cresol and (b) a mixture of aldehydes comprising formaldehyde or a formaldehyde precursor and a monohydroxy aromatic aldehyde selected from the group consisting of 2-hydroxybenzaldehyde, 3-hydroxybenzaldehyde and 4-hydroxybenzaldehyde, wherein the cresol and aldehyde components of the novolak resin are present in the following amounts:

$$\frac{\text{moles total aldehyde}}{\text{moles total cresol}} \times 100 = \text{about 60\% to about 95\%},$$

$$\frac{\text{moles monohydroxy aromatic aldehyde}}{\text{moles total aldehyde}} \times 100 = \text{about 15\% to about 95\%},$$

and wherein the m- and p-cresol are present in the following amounts:

$$\frac{\text{moles m-cresol}}{\text{moles total cresol}} \times 100 = \text{about 30\% to about 75\%}.$$

* * * * *